(12) United States Patent
Han et al.

(10) Patent No.: US 11,823,927 B2
(45) Date of Patent: Nov. 21, 2023

(54) WAFER INSPECTION APPARATUS AND SYSTEM INCLUDING THE SAME

(71) Applicant: Samsung Electronics Co., Ltd., Suwon-si (KR)

(72) Inventors: Kyunghun Han, Hwaseong-si (KR); Ingi Kim, Seoul (KR); Sangwoo Bae, Seoul (KR); Jungchul Lee, Hwaseong-si (KR); Minhwan Seo, Hwaseong-si (KR); Myeongock Ko, Hwaseong-si (KR); Youngjoo Lee, Hwaseong-si (KR); Taehyun Kim, Suwon-si (KR); Seulgi Lee, Suwon-si (KR)

(73) Assignee: Samsung Electronics Co., Ltd.

( * ) Notice: Subject to any disclaimer, the term of this patent is extended or adjusted under 35 U.S.C. 154(b) by 312 days.

(21) Appl. No.: 17/229,197

(22) Filed: Apr. 13, 2021

(65) Prior Publication Data
US 2022/0068681 A1    Mar. 3, 2022

(30) Foreign Application Priority Data

Sep. 2, 2020 (KR) .......................... 10-2020-0111812

(51) Int. Cl.
*G01J 3/14* (2006.01)
*H01L 21/67* (2006.01)
(Continued)

(52) U.S. Cl.
CPC ....... *H01L 21/67288* (2013.01); *G01N 21/41* (2013.01); *G01N 21/65* (2013.01);
(Continued)

(58) Field of Classification Search
CPC ... H01L 21/67288; H01L 22/12; G01N 21/41; G01N 21/65; G01N 21/9505;
(Continued)

(56) References Cited

U.S. PATENT DOCUMENTS

| 4,538,909 A | * | 9/1985 | Bible | G01N 21/956 356/239.1 |
| 4,844,617 A | * | 7/1989 | Kelderman | G01J 3/02 250/201.3 |

(Continued)

FOREIGN PATENT DOCUMENTS

JP          3928045 B2    3/2007

*Primary Examiner* — Abdullahi Nur
(74) *Attorney, Agent, or Firm* — Myers Bigel, P.A.

(57) ABSTRACT

A wafer inspection apparatus includes: an objective lens on an optical path of first and second input beams; and an image sensor configured to generate an image of the wafer based on scattered light according to a nonlinear optical phenomenon based on the first and second input beams, wherein the first input beam passing through the objective lens is obliquely incident on the wafer at a first incident angle with respect to a vertical line that is normal to an upper surface of the wafer, the second input beam passing through the objective lens is incident on the wafer at a second incident angle oblique to the vertical line that is normal to the upper surface of the wafer, and the first and second incident angles are different from each other.

20 Claims, 12 Drawing Sheets

(51) Int. Cl.
  *G02B 7/02* (2021.01)
  *G06T 5/20* (2006.01)
  *G06T 7/00* (2017.01)
  *G01N 21/41* (2006.01)
  *G01N 21/95* (2006.01)
  *G01N 21/65* (2006.01)

(52) U.S. Cl.
  CPC ......... *G01N 21/9505* (2013.01); *G02B 7/021* (2013.01); *G06T 5/20* (2013.01); *G06T 7/0004* (2013.01); *G01N 2021/653* (2013.01); *G01N 2201/06113* (2013.01); *G06T 2207/30148* (2013.01)

(58) Field of Classification Search
  CPC ... G01N 2021/653; G01N 2201/06113; G01N 21/956; G01N 21/636; G01N 2021/655; G02B 7/021; G02B 21/0016; G02B 21/082; G06T 7/0004; G06T 2207/30148
  See application file for complete search history.

(56) References Cited

U.S. PATENT DOCUMENTS

| | | | | |
|---|---|---|---|---|
| 4,893,932 A * | 1/1990 | Knollenberg | ...... | G01N 21/9501 356/369 |
| 5,268,744 A * | 12/1993 | Mori | ...... | G03F 9/7023 250/201.4 |
| 5,923,423 A * | 7/1999 | Sawatari | ...... | G01N 21/94 356/237.5 |
| 5,936,726 A * | 8/1999 | Takeda | ...... | G01N 21/94 356/237.4 |
| 5,982,732 A * | 11/1999 | Yamanaka | ...... | G11B 7/1356 369/44.37 |
| 5,999,509 A * | 12/1999 | Sugiura | ...... | G11B 7/1356 369/44.37 |
| 6,064,477 A * | 5/2000 | Matsumoto | ...... | G01N 21/95623 356/237.2 |
| 6,226,079 B1 * | 5/2001 | Takeda | ...... | G01N 21/9501 356/237.2 |
| 6,317,514 B1 * | 11/2001 | Reinhorn | ...... | G01N 21/95692 382/145 |
| 6,674,573 B2 | 1/2004 | Suzuki | | |
| 6,791,099 B2 | 9/2004 | Some et al. | | |
| 6,922,236 B2 | 7/2005 | Vaez-Iravani et al. | | |
| 7,643,139 B2 | 1/2010 | Ohshima et al. | | |
| 8,896,827 B2 | 11/2014 | Chimmalgi et al. | | |
| 8,929,406 B2 | 1/2015 | Chuang et al. | | |
| 10,921,369 B2 * | 2/2021 | Chism | ...... | G01R 31/2831 |
| 2003/0063551 A1 * | 4/2003 | Takeuchi | ...... | G11B 7/1359 |
| 2003/0123369 A1 * | 7/2003 | Fujita | ...... | G11B 7/1374 |
| 2003/0231302 A1 * | 12/2003 | Hunt | ...... | G01N 21/94 356/237.2 |
| 2007/0096038 A1 * | 5/2007 | Tsai | ...... | G01N 21/6458 250/458.1 |
| 2011/0249545 A1 * | 10/2011 | Hotta | ...... | G11B 7/1353 369/112.05 |
| 2015/0168304 A1 * | 6/2015 | Wouters | ...... | G01N 21/6489 250/459.1 |
| 2015/0241351 A1 * | 8/2015 | Cooper | ...... | G01N 21/6458 250/459.1 |
| 2018/0188319 A1 * | 7/2018 | Chism, II | ...... | G01R 31/309 |
| 2018/0209905 A1 | 7/2018 | Ketaki et al. | | |
| 2019/0302025 A1 | 10/2019 | Jung et al. | | |

* cited by examiner

WAFER INSPECTION APPARATUS AND SYSTEM INCLUDING THE SAME

CROSS-REFERENCE TO RELATED APPLICATION

This application is based on and claims priority under 35 U.S.C. § 119 to Korean Patent Application No. 10-2020-0111812, filed on Sep. 2, 2020, in the Korean Intellectual Property Office, the disclosure of which is incorporated by reference herein in its entirety.

BACKGROUND

The inventive concept relates to a wafer inspection apparatus and a system including the same, and more particularly, to a wafer inspection apparatus capable of inspecting for defects on a wafer on which a pattern is not formed and a system including the wafer inspection apparatus.

Recently, as semiconductor devices have become extremely integrated and miniaturized, the size of particles that may cause defects in semiconductor devices is also getting smaller and smaller. Conventionally, the requirement for detecting fine particles has been met by shortening the wavelength of the input light used for particle detection. However, recently, as the need for detecting ultrafine particles of 10 nm or less has emerged, the Rayleigh diffraction limit has been reached. Accordingly, new inspection methods for the detection of ultrafine particles have been studied.

SUMMARY

The problem to be solved by the technical idea of the inventive concept is to provide a wafer inspection apparatus and a system including the same.

According to example embodiments for achieving the above technical problem, a wafer inspection apparatus is provided. The apparatus may include a stage configured to support a wafer; a first laser device configured to emit a first input beam to the wafer; a second laser device configured to emit a second input beam to the wafer; an objective lens on an optical path of the first and second input beams; and an image sensor configured to generate an image of the wafer based on scattered light according to a nonlinear optical phenomenon based on the first and second input beams, wherein the first input beam passing through the objective lens is obliquely incident on the wafer at a first incident angle with respect to a vertical line that is normal to an upper surface of the wafer, the second input beam passing through the objective lens is incident on the wafer at a second incident angle oblique to the vertical line that is normal to the upper surface of the wafer, and the first and second incident angles are different from each other.

According to example embodiments, a system including a wafer processing apparatus and a wafer inspection apparatus is provided. The wafer inspection apparatus may include a first input optical system configured to irradiate a first input beam onto a wafer; a second input optical system configured to irradiate a second input beam onto the wafer; an objective lens configured to overlap the first and second input beams on a portion of the wafer; and an image sensor configured to generate an image of the wafer based on nonlinear scattered light generated from the portion of the wafer based on the first and second input beams, wherein the paths of the first and second input beams may be each spaced apart from an optical axis of the objective lens.

According to example embodiments, a wafer inspection apparatus is provided. The apparatus may include a first input optical system configured to emit a first input beam to a wafer; a second input optical system configured to emit a second input beam to the wafer; an objective lens configured to overlap the first and second input beams on a portion of the wafer; and an image sensor configured to generate an image of the wafer based on nonlinear scattered light generated from the portion of the wafer based on the first and second input beams.

According to example embodiments, a wafer inspection apparatus is provided. The apparatus may include a first laser device configured to emit a first input beam to a wafer; a second laser device configured to emit a second input beam to the wafer; an objective lens on an optical path of the first and second input beams; a first focusing lens located between the first laser device and the objective lens and configured to focus the first input beam on a back focal plane of the objective lens; and a second focusing lens located between the second laser device and the objective lens and configured to focus the second input beam on the back focal plane of the objective lens.

According to example embodiments, a method of manufacturing a semiconductor device is provided. The method may include loading a non-patterned wafer into a wafer processing apparatus; unloading the non-patterned wafer from the wafer processing apparatus and loading the unloaded wafer into a wafer inspection apparatus; inspecting the non-patterned wafer; determining a state of the wafer processing apparatus based on the inspection result of the non-patterned wafer, wherein the non-patterned wafer has a nonlinear optical coefficient less than that of silicon.

The technical effects achieved through the inventive concept are not limited to the technical effects mentioned above, and other technical effects that are not mentioned will be clearly understood by those of ordinary skill in the art to which the inventive concept belongs from the following description.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
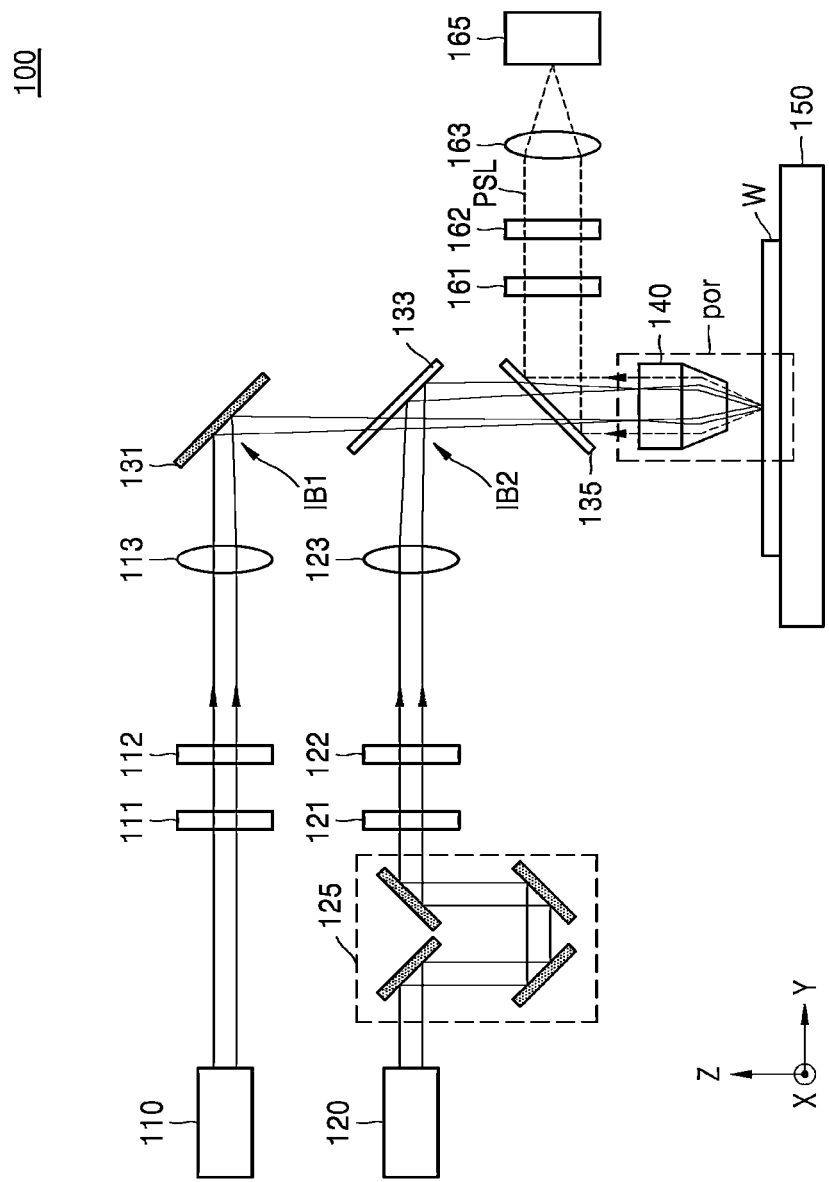
FIG. 1 is a schematic diagram for describing a wafer processing apparatus according to example embodiments.

Hereinafter, embodiments of the inventive concept will be described in detail with reference to the accompanying drawings. The same reference numerals are used for the same components in the drawings, and redundant descriptions thereof may be omitted in the interest of brevity.

FIG. 1 is a schematic diagram illustrating a wafer inspection apparatus 100 according to example embodiments.

Referring to FIG. 1, the wafer inspection apparatus 100 may include a first laser device 110, a first half-wave plate 111, a first polarizer 112, and a first focusing lens 113, a second laser device 120, a second half-wave plate 121, a second polarizer 122, a second focusing lens 123, a mirror 131, a first dichroic mirror 133, a second dichroic mirror 135, an objective lens 140, a stage 150, a third polarizer 161, a band pass filter 162, an imaging lens 163, and an image sensor 165.

The wafer inspection apparatus 100 may inspect the wafer W non-destructively. Non-destructive inspection of wafers is divided into inspection of patterned wafers and inspection of non-patterned wafers.

Here, two directions parallel to the upper surface of the wafer W and perpendicular to each other are defined as the X direction and the Y direction, and the direction perpendicular to the upper surface of the wafer W is defined as the Z direction. Unless otherwise specified, the definition of the direction is the same in the following drawings.

Inspection of patterned wafers includes various types of inspection, including electron beam inspection, brightfield inspection, darkfield inspection, and the like. Random defects on the patterned wafer are mainly caused by particle contamination, and occur at random locations on the wafer. Since it is very unlikely that a random defect will occur repeatedly at a specific location, it is possible to determine whether and where a random defect has occurred by performing a comparison of images of adjacent dies (i.e., chips) on the patterned wafer. In some cases, inspection of the patterned wafer may be performed by comparison with a standard die.

Inspection of non-patterned wafers may be used for wafer integrity inspection during wafer manufacturing, wafer contamination inspection during transportation, wafer incoming inspection by device manufacturers, and inspection of wafer handling equipment using dummy wafers. Since no pattern is formed on the non-patterned wafer, defects may be detected directly without image comparison between chips.

When a laser beam is irradiated to particles on a wafer, light scattered by the particles may be detected by the image sensor. It is possible to inspect the entire surface of the wafer by rotating the wafer on which the laser is irradiated. The positional coordinates of the particles may be determined from the wafer rotation angle and the radial position of the laser beam. Defects on the wafer may include crystal defects such as crystal originated particles (COP) in addition to particles.

Inspection of such a non-patterned wafer may be performed based on the cycle of a reliability test of a wafer processing equipment. For example, when a wafer processing equipment has processed a set number of wafers or a set number of wafer lots, the wafer processing equipment may be inspected by a non-patterned wafer inspection method.

The wafer inspection apparatus 100 may inspect the wafer W on which the pattern is not formed. According to some embodiments, the wafer inspection apparatus 100 may inspect the wafer W using a nonlinear optical phenomenon. According to some embodiments, the wafer inspection apparatus 100 may inspect the wafer W by using a nonlinear optical phenomenon using two input beams.

In more detail, the wafer inspection apparatus 100 may irradiate the first and second input beams IB1 and IB2 onto the wafer W, and may detect particles on the wafer W based on scattered light (hereinafter, nonlinear scattered light) generated by a nonlinear optical phenomenon in the portion of the wafer W in which the first and second input beams IB1 and IB2 are irradiated. The wafer inspection apparatus 100 may detect only particle scattered light (PSL), which is nonlinear scattered light generated by particles on the wafer W. Here, the PSL may be reflected scattered light. The wafer inspection apparatus 100 may prevent noise such as scattered light generated by the surface roughness of the wafer W from being detected. Accordingly, since noise is not involved in the inspection of the wafer inspection apparatus 100, the wafer inspection apparatus 100 may inspect an ultra-fine pattern or particle of 10 nm or less.

According to some embodiments, the wafer inspection apparatus 100 may inspect the wafer W using a third-order nonlinear optical phenomenon. According to some embodiments, the wafer inspection apparatus 100 may inspect the wafer W using four-wave mixing (FWM). According to some embodiments, the wafer inspection apparatus 100 may inspect the wafer W using any one of coherent anti-Stokes Raman scattering (CARS), sum frequency generation (SFG), and difference frequency generation (DFG).

However, the present invention is not limited thereto, and the wafer inspection apparatus 100 may inspect the wafer W using various nonlinear optical phenomena of secondary, tertiary, and fourth or higher order.

Second-order nonlinear optical phenomena that may be used by the wafer inspection apparatus 100 include second harmonic generation (SHG) and an optical parametric process.

Third-order nonlinear optical phenomena that may be used by the wafer inspection apparatus 100 include third harmonic generation (THG), third-order SFG (TSFG), stimulated Raman scattering (SRS), optical Kerr effect (OKE), Raman induced Kerr effect (RIKE), stimulated Rayleigh scattering, stimulated Brillouin scattering (SBS), stimulated Kerr scattering, stimulated Rayleigh-Bragg scattering, stimulated Mie scattering, self phase modulation (SPM), cross phase modulation (XPM), optical-field induced birefringence, and electric-field induced SHG.

Fourth or more nonlinear optical phenomena that may be used by the wafer inspection apparatus 100 include hyper-Raman scattering, hyper-Rayleigh scattering, and coherent anti-Stokes hyper-Raman scattering.

The first laser device 110 may generate a first input beam IB1, and the second laser device 120 may generate a second input beam IB2. Each of the first and second input beams IB1 and IB2 may have a wavelength in an infrared band. Each of the first and second input beams IB1 and IB2 may have a wavelength of about 700 nm or more. In one example, the wavelength of the first input beam IB1 may be about 785 nm, and the wavelength of the second input beam IB2 may be about 1035 nm.

Each of the first and second laser devices 110 and 120 may generate a pulsed laser beam. The first and second laser devices 110 and 120 may adjust the pulse widths of the first and second input beams IB1 and IB2. Lasers generated by the first and second laser devices 110 and 120 may have the same pulse frequency so that they may be simultaneously irradiated on the wafer W. Here, the pulse frequency is the number of pulses emitted per unit time (e.g., 1 second).

According to some embodiments, the first and second laser devices 110 and 120 may be implemented as a single pump laser device and an optical parametric oscillator. According to some embodiments, the first and second laser devices 110 and 120 may be implemented with a single pump laser device and an optical parametric amplifier. According to some embodiments, the first and second laser devices 110 and 120 may be separate laser devices synchronized with each other.

The first input beam IB1 emitted by the first laser device 110 may sequentially pass through the first half-wave plate 111, the first polarizer 112, and the first focusing lens 113. The first input beam IB1 that has passed through the first focusing lens 113 is reflected by the mirror 131 and passes through the first and second dichroic mirrors 133 and 135, and then may be focused on a back focal plane (BFP, see FIG. 2) of the objective lens 140. The first input beam IB1 may be substantially vertically incident on the objective lens 140, but is not limited thereto. The first input beam IB1 may be irradiated onto the wafer W through the objective lens 140.

The first input beam IB1 incident on the first half-wave plate 111 may be linearly polarized light. The first half-wave plate 111 may rotate the polarization direction of the first input beam IB1 by about 90°. The first half-wave plate 111 may prevent the intensity of the first input beam IB1 from being decreased due to a difference between a polarization direction of the first input beam IB1 and a polarization axis of the first polarizer 112.

The first polarizer 112 may pass only a polarization component in a predetermined direction of the first input beam IB1. The first polarizer 112 may be any one of a wire grid polarizer and a glan prism polarizer.

The first focusing lens 113 may focus the first input beam IB1. The first input beam IB1 incident on the first focusing lens 113 may be a collimated light beam, but is not limited thereto. For example, the first input beam IB1 may be diffracted or diverged. Here, that the first input beam IB1 is collimated means that the beam cross section of the first input beam IB1 is maintained substantially constant as the first input beam IB1 progresses. The first input beam IB1 may be focused on the back focal plane (BFP, see FIG. 2) of the objective lens 140 by the first focusing lens 113.

The first laser device 110, the first half-wave plate 111, the first polarizer 112, the first focusing lens 113 and the mirror 131 may constitute a first input optical system. At least one of the optical elements of the first input optical system may be configured to be drivable. For example, the mirror 131 may include a driving device. Accordingly, the position on the back focal plane BFP (refer to FIG. 2) of the objective lens 140 on which the first input beam IB1 is focused may be adjusted.

The second input beam IB2 emitted by the second laser device 120 may sequentially pass through the second half-wave plate 121, the second polarizer 122, and the second focusing lens 123. The second input beam IB2 that has passed through the second focusing lens 123 is reflected by the first dichroic mirror 133 and passes through the second dichroic mirror 135, and is then focused on the objective lens 140, and then may be focused on the back focal plane BFP (refer to FIG. 2) of the objective lens 140. The second input beam IB2 may be substantially vertically incident on the objective lens 140, but is not limited thereto. The second input beam IB2 may be irradiated onto the wafer W through the objective lens 140.

The second input beam IB2 incident on the second half-wave plate 121 may be linearly polarized light. The second half-wave plate 121 may rotate the polarization direction of the second input beam IB2 by about 90°. The second half-wave plate 121 may prevent the intensity of the second input beam IB2 from decreasing due to a difference between the polarization direction of the second input beam IB2 and the polarization axis of the second polarizer 122.

The second polarizer 122 may pass only a polarization component in a predetermined direction of the second input beam IB2. The second polarizer 122 may be any one of a wire grid polarizer and a glan prism polarizer.

The second focusing lens 123 may focus the second input beam IB2. The second input beam IB2 incident on the second focusing lens 123 may be a collimated light beam, but is not limited thereto. For example, the second input beam IB2 may be diffracted or diverged. The second input beam IB2 may be focused on the back focal plane BFP (refer to FIG. 2) of the objective lens 140 by the second focusing lens 123.

According to example embodiments, a displacement stage 125 including a plurality of mirrors may be further provided between the second laser device 120 and the second half-wave plate 121. By the displacement stage 125, the length of the optical path of the first input beam IB1 from the first laser device 110 to the wafer W and the length of the optical path of the second input beam IB2 from the second laser device 120 to the wafer W may be substantially the same.

The second laser device 120, the second half-wave plate 121, the second polarizer 122, the second focusing lens 123, and the first dichroic mirror 133 may constitute a second input optical system. At least one of the optical elements of the second input optical system may be configured to be drivable. For example, the first dichroic mirror 133 may include a driving device. Accordingly, the position on the back focal plane BFP (refer to FIG. 2) of the objective lens 140 on which the second input beam IB2 is focused may be adjusted.

When the first and second input beams IB1 and IB2 are irradiated to a set position on the wafer W through the objective lens 140, the wafer W may emit scattered light. According to example embodiments, of the scattered light, only the PSL due to a defect formed on the wafer W may be incident on the objective lens 140. Of the scattered light, scattered light due to the roughness of the surface of the wafer W may not be incident on the objective lens 140. Accordingly, since noise due to the roughness of the surface of the wafer W is removed, reliability of inspection of the non-patterned wafer W may be improved.

The PSL incident on the objective lens 140 may have a wavelength of a visible light band. A first frequency $\omega_1$ that is a frequency of the first input beam IB1, a second frequency $\omega_2$ that is a frequency of the second input beam IB2, and a third frequency that is the frequency of the PSL incident on the objective lens 140 satisfies Equation 1 below.

$$\omega_3 = 2\omega_2 - \omega_1 \qquad \text{[Equation 1]}$$

According to Equation 1, for example, when the wavelength of the first input beam IB1 is about 785 nm and the wavelength of the second input beam IB2 is about 1035 nm, the frequency of the first input beam IB1 is about 381.90 THz, and the frequency of the second input beam IB2 is about 289.66 THz. In this case, the frequency of the PSL by the FWM may be about 474.15 THz, and the wavelength of the PSL corresponding thereto may be about 632 nm.

The PSL incident on the objective lens 140 may be reflected by the second dichroic mirror 135, and may pass through the third polarizer 161, the band pass filter 162, and the imaging lens 163 to reach the image sensor 165.

Only a specific polarization component of the PSL by the third polarizer 161 may be measured by the image sensor 165. The third polarizer 161 may be any one of a wire grid polarizer and a glan prism polarizer.

The band pass filter 162 may pass only light of a set wavelength band among the PSL. According to the selection of the bandwidth of the band pass filter 162, the frequency of the PSL detected by the image sensor 165 may be determined. As an example, when the band pass filter 162 has a first pass band through which the PSL by FWM is passed, the PSL by the FWM may be detected by the image sensor 165. As another example, when the band pass filter 162 has a second pass band through which PSL by SHG passes, the PSL by SHG may be detected by the image sensor 165.

According to some embodiments, the band pass filter 162 may be a filter having a variable pass band. A filter having a variable pass band may include, for example, a turret composed of a plurality of band pass filters. Accordingly, the band pass filter 162 passes the PSL by FWM so that the image sensor 165 detects the PSL by the FWM, and then may pass the PSL by CARS so that the image sensor 165 detects the PSL by CARS.

The first and second input beams IB1 and IB2 may be irradiated only with less than or equal to the critical power causing damage on the wafer W. According to example embodiments, since the first and second input beams IB1 and IB2 have a wavelength in an infrared band, they have a higher threshold power than input light in a low wavelength (i.e., high frequency) band. Accordingly, it is possible to use the first and second input beams IB1 and IB2 of relatively high power, and to increase the intensity of the PSL, which is a signal to be inspected. Since the wafer inspection apparatus 100 is a noise-free inspection apparatus, a signal to noise ratio (SNR) may be improved by increasing the intensity of the PSL as a signal.

The PSL passing through the band pass filter 162 may be focused on the image sensor 165 by the imaging lens 163. According to example embodiments, the image sensor 165 may be any one of an electron multiplying charged coupled device (EMCCD) camera and a time delay integration (TDI) sensor. When the image sensor 165 is an EMCCD camera, the image sensor 165 may have high detection power even if the signal of the PSL generated by the nanoscale defect is small. When the image sensor 165 is a TDI sensor, the inspection speed of the wafer inspection apparatus 100 may be improved.

According to example embodiments, measurement of the image sensor 165 may be triggered by the pulse frequency of the first and second laser devices 110 and 120. According to example embodiments, the first and second input beams IB1 and IB2 may be pulsed beams, and the image sensor 165 may sense the PSL during a time when the pulses of the first and second input beams IB1 and IB2 are emitted. Accordingly, it is possible to prevent noise from being detected by the image sensor 165 during an off duty of the first and second input beams IB1 and IB2, and thus the SNR of the wafer inspection apparatus 100 may be further improved.

According to example embodiments, the wafer inspection apparatus 100 includes the objective lens 140 with a high magnification and the image sensor 165 with a high resolution, and at the same time, may inspect the wafer W using the first and second input beams IB1 and IB2, which are off-axial rays having a relatively large beam cross section. Accordingly, since the wafer inspection apparatus 100 may perform wide-field imaging with resolution at the diffraction limit, the inspection speed of the wafer inspection apparatus 100 may be improved.

The stage 150 may translate the wafer W in the X direction, the Y direction, and the Z direction, or may rotate the wafer W about the Z direction. For example, the stage 150 may move the wafer W in the Z direction so that the first and second input beams IB1 and IB2 overlap each other on the wafer W and are focused near the surface of the wafer W. The stage 150 may rotate the wafer W in the Z direction or may move the wafer W along the X and Y directions so that the first and second input beams IB1 and IB2 are irradiated onto a set position on the wafer W.

According to example embodiments, the wafer inspection apparatus 100 may include a controller and a processor for controlling optical elements. The controller and processor may be implemented in hardware, firmware, software, or any combination thereof. For example, the controller and processor may include computing devices such as a workstation computer, a desktop computer, a laptop computer, and a tablet computer. The controller and the processor may include a simple controller, a microprocessor, a complex processor such as a CPU, a GPU, or the like, a processor configured by software, and dedicated hardware or firmware. The controller and processor may be implemented by, for example, a general-purpose computer or application-specific hardware such as a digital signal process (DSP), a field programmable gate array (FPGA), and an application specific integrated circuit (ASIC).

According to some embodiments, the operation of the controller and the processor may be implemented as instructions stored on a machine-readable medium that may be read and executed by one or more processors. Here, the machine-readable medium may include any mechanism for storing and/or transmitting information in a form readable by a machine (e.g., a computing device). For example, machine-readable media include read only memory (ROM), random access memory (RAM), magnetic disk storage media, optical storage media, flash memory devices, electrical, optical, acoustic or other forms of radio signals (for example, carrier waves, infrared signals, digital signals, etc.) and other arbitrary signals.

In addition, firmware, software, routines, and instructions may be configured for performing the operations described with respect to the controller and the processor or any process described below. For example, the controller may be implemented by software that generates a signal for controlling oscillation of the first and second laser devices 110 and 120, generates a signal for driving at least some of the first and second input optical systems to adjust the position on the back focal plane BFP of the objective lens 140 on which each of the first and second input beams IB1 and IB2 is focused, and generates signals for controlling the translational and rotational motions of the stage 150. The processor may be implemented by software configured to determine the presence and location of a defect using an image measured by the image sensor 165. However, this is for convenience of description, and operations of the above-described controller and processor may be caused by computing devices, processors, and other devices that execute firmware, software, routines and instructions.

Hereinafter, the effect of the wafer inspection apparatus 100 according to example embodiments will be described in more detail with reference to FIGS. 1 and 2.

Figure 2:
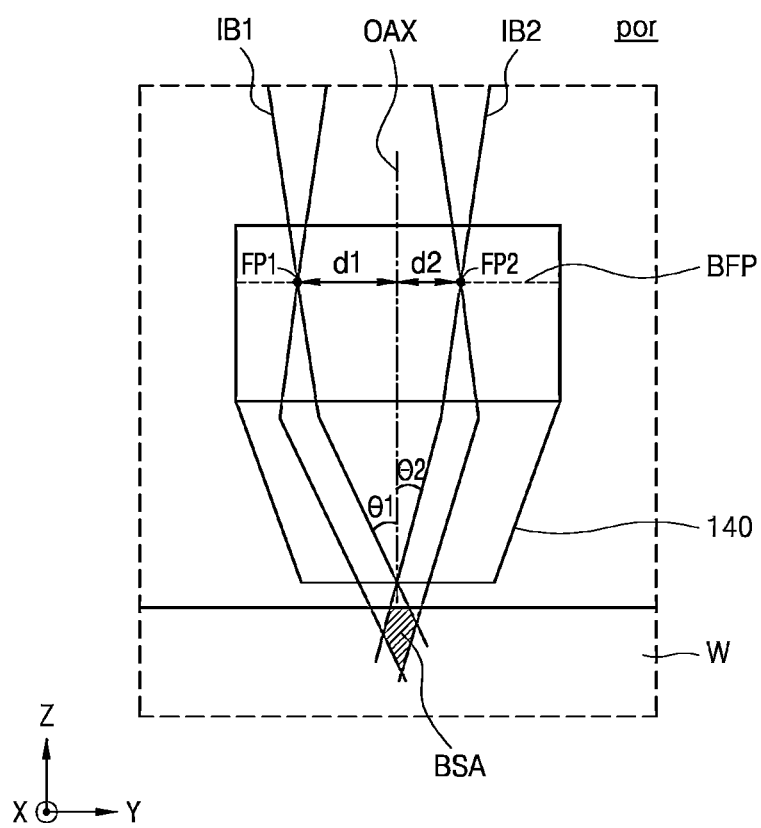
FIG. 2 is an enlarged view of a portion of FIG. 1.

FIG. 2 is an enlarged view of a portion (por) of FIG. 1.

Referring to FIGS. 1 and 2, the first and second input beams IB1 and IB2 may be focused on the back focal plane BFP of the objective lens 140, respectively. The light rays focused on the back focal plane BFP of the lens are output as parallel light. Accordingly, the first and second input beams IB1 and IB2 passing through the objective lens 140 may be collimated rays, respectively.

A focal point of the first input beam IB1 on the back focal plane BFP is the first focal point FP1, and a focal point of the second input beam IB2 on the back focal plane BFP is the second focal point FP2. The first and second focal points FP1 and FP2 may be spaced apart from each other and an optical axis or central axis OAX of the objective lens 140 interposed therebetween. Since the first and second input beams IB1 and IB2 are focused on the back focal plane BFP of the objective lens 140, the first and second input beams IB1 and IB2 emitted from the objective lens 140 may be a collimated ray. Accordingly, the first and second input beams IB1 and IB2 obliquely incident on the wafer W may overlap in the beam superposition area BSA on the wafer W. The beam superposition area BSA is an area where the first and second input beams IB1 and IB2 superpose, and the scattered light due to the nonlinear optical phenomenon described with reference to FIG. 1 may be generated from the beam superposition area BSA.

The first focal point FP1 may be spaced apart from the optical axis OAX of the objective lens 140 by a first distance d1 in the horizontal direction, and the second focal point FP2 may be spaced apart from the optical axis OAX of the objective lens 140 by a second distance d2 in the horizontal direction. A first incident angle θ1 of the first input beam IB1 may be determined by the first distance d1, and a second incident angle θ2 of the second input beam IB2 may be determined by the second distance d2.

Here, the optical axis OAX of the objective lens 140 may be one of the normal lines on the wafer W. Accordingly, the first and second incident angles θ1 and θ2 may be angles at which the first and second input beams IB1 and IB2 are incident on the wafer W, and may be angles formed by the traveling directions of the first and second input beams IB1 and IB2 and the optical axis OAX.

According to example embodiments, the first and second input beams IB1 and IB2 may be incident on the wafer W through different paths. When the first and second input beams are incident on the wafer W through the same optical path, scattered light according to a nonlinear optical phenomenon may be generated in all portions of the inside of the wafer W on the same optical path of the first and second input beams. In this case, there is a problem in that the SNR decreases as noise generated inside the wafer W increases.

According to example embodiments, the first and second input beams IB1 and IB2 may be irradiated to the wafer W through different optical paths. According to some embodiments, the first and second input beams IB1 and IB2 may be obliquely incident on the wafer W at different angles. Accordingly, the size of the beam superposition area BSA may be reduced, and the beam superposition area BSA may be limited to the vicinity of the wafer W surface.

As described above, each of the first and second input optical systems may adjust first and second distances d1 and d2 that are relative positions of the first and second focal points FP1 and FP2 with respect to the optical axis OAX. Accordingly, the first incident angle θ1 and the second incident angle θ2 may be adjusted, wherein the first incident angle θ1 is an angle between the normal line on the wafer W (or the optical axis OAX or a vertical line parallel thereto) and the traveling direction of the first input beam IB1, and the second incident angle θ2 is an angle between the normal line on the wafer W (or the optical axis OAX or a vertical line parallel thereto) and the traveling direction of the second input beam IB2.

For example, as each of the first and second distances d1 and d2 increases, each of the first and second incident angles θ1 and θ2 may be large. The first and second distances d1 and d2 may have different values. For example, the first distance d1 may be larger than the second distance d2, and in this case, the first incident angle θ1 may be larger than the second incident angle θ2.

As described above, the non-patterned wafer inspection is for determining defects on the wafer W caused by the wafer processing equipment. Due to the recent high integration and miniaturization of semiconductor processes, ultra-fine particles of 10 nm or less are also a factor causing die failure, and these ultrafine particles of 10 nm or less have a size similar to the roughness of the surface of the non-patterned wafer W. Accordingly, in order to detect ultrafine particles of 10 nm or less, it is required to reduce noise due to the roughness of the surface of the wafer W itself in addition to the particles.

According to example embodiments, the scattered lights due to the roughness of the surface of the wafer W do not enter the objective lens 140, and only light scattered by the ultrafine particles may be incident on the objective lens 140. This will be described in more detail with reference to FIGS. 3 and 4.

Figure 3:
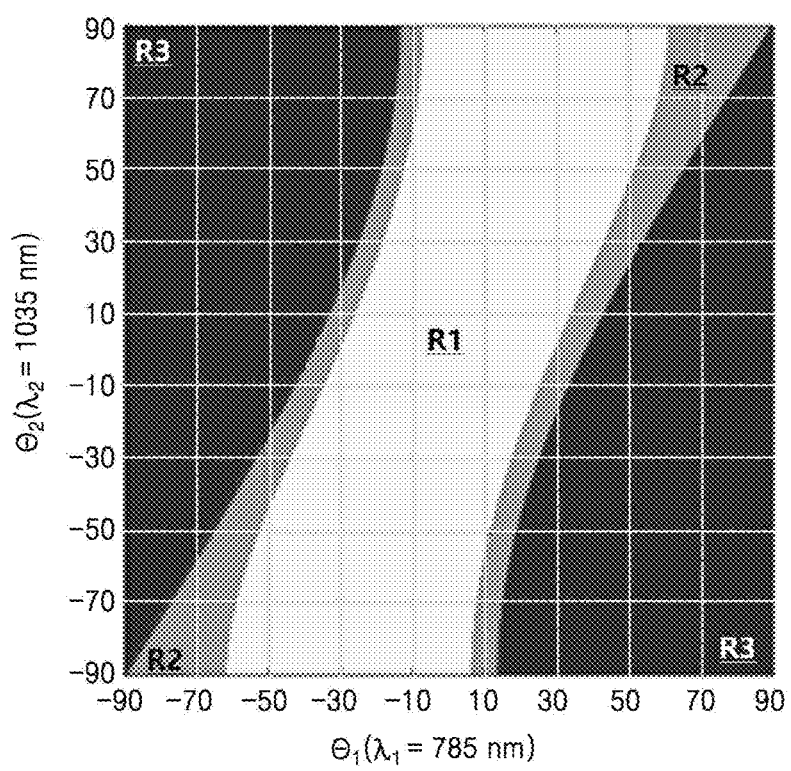
FIG. 3 is a graph for explaining the effect of a wafer inspection apparatus according to example embodiments.

FIG. 3 is a graph for explaining the effect of the wafer inspection apparatus 100 (see FIG. 1) according to example embodiments.

Figure 4:
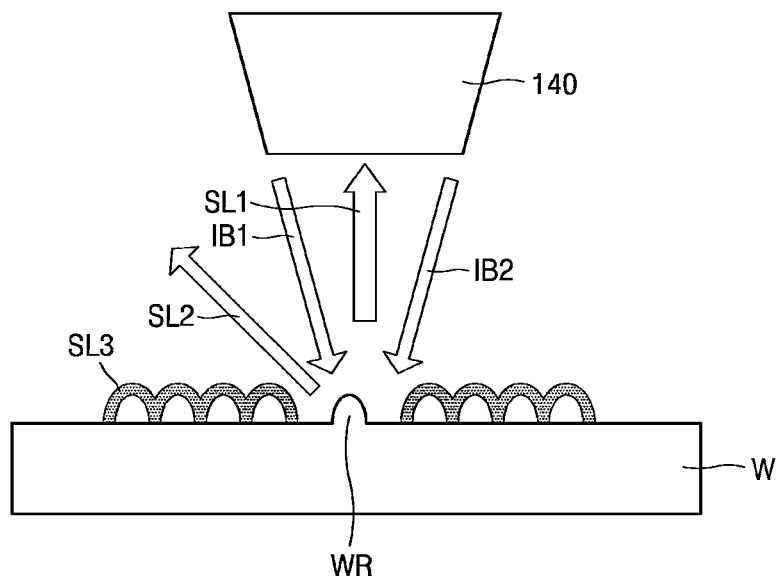
FIG. 4 is a conceptual diagram illustrating an effect of a wafer inspection apparatus according to example embodiments.

FIG. 4 is a conceptual diagram illustrating an effect of the wafer inspection apparatus 100 (see FIG. 1) according to example embodiments.

In more detail, FIG. 3 shows the characteristics of scattered lights due to the roughness of the wafer surface according to the first and second incident angles θ1 and θ2, and FIG. 4 illustrates removal of a noise signal according to characteristics of scattered lights due to the roughness of the wafer surface.

Referring to FIGS. 2 to 4, when the first and second incident angles θ1 and θ2 are within the first region R1 (e.g., when the first incident angle θ1 is about −10° and the second incident angle θ2 is about 10°), the scattered light due to the roughness WR on the surface of the wafer W may be emitted in the form of a plane wave like the first scattered light SL1 and may be incident on the objective lens 140.

When the first and second incident angles θ1 and θ2 are within the second region R2 (e.g., when the first incident angle θ1 is about −30° and the second incident angle θ2 is about) 10°, noise scattered light due to the roughness WR on the surface of the wafer W may be emitted in the form of a plane wave like the second scattered light SL2 but may not be incident on the objective lens 140.

When the first and second incident angles θ1 and θ2 are within the third region R3 (e.g., when the first incident angle θ1 is about −50° and the second incident angle θ2 is about 10°), noise scattered light due to the roughness WR on the surface of the wafer W may travel along the surface of the wafer W in the form of an evanescent wave like the third scattered light SL3.

In contrast, since nonlinear scattered light generated by the particle defects on the surface of the wafer W is isotropically emitted around the particle, and the nonlinear scattered light may be incident on the objective lens 140 without depending on the first and second incident angles θ1 and θ2.

Referring back to FIGS. 1 to 3, when the first and second incident angles θ1 and θ2 are within the second and third regions R2 and R3, since the noise scattered light due to the roughness of the surface of the wafer W is not incident on the objective lens 140, only light scattered by the particles on the surface of the wafer W may be detected by the image sensor 165. According to example embodiments, since the first and second incident angles θ1 and θ2 may be adjusted so that scattered light due to roughness on the surface of the wafer W is not incident on the objective lens 140, the wafer inspection apparatus 100 may perform a substantially noise-free inspection.

The wafer W to be inspected may have a lower nonlinear optical coefficient than that of a silicon wafer. According to some embodiments, the wafer W may be a glass, for example, a fused silica substrate. In the conventional inspection method using linear optical phenomenon, a glass wafer was not used as a non-patterned wafer. The intensity and progression of light scattered in Rayleigh scattering, which is a typical linear optical phenomenon, depend on the size and shape of the structure causing the scattering. Therefore, in the case of inspection of the same type of defect, the change of the substrate material does not substantially affect the inspection result.

On the other hand, in the case of using a nonlinear optical phenomenon, the intensity at which nonlinear scattered light is generated is determined by the nonlinear coefficient of the material to which the light is irradiated. Since the nonlinear coefficient of glass is about $\frac{1}{10000}$ times that of silicon, when a glass wafer (e.g., a fused silica wafer) is used instead of a silicon wafer, the SNR may be greatly improved. Table 1 shows a comparison of the number of noise photons generated in the silicon wafer and the glass wafer with the noise of the image sensor 165 itself. Here, the SNR is calculated by dividing the difference between the measured signal and the DC noise by the standard deviation of the corresponding noise.

TABLE 1

| Substrate type | Average | Standard deviation | SNR |
| --- | --- | --- | --- |
| Silicon wafer | 1400 | 76 | 260 |
| Fused silica wafer | 30 | 5 | 4000 |
| Self noise | 8 | 4 | — |

The average value of the number of noise photons of the fused silica wafer is about 46 times lower than that of the silicon wafer, and the standard deviation of the number of noise photons is similar to that of the image sensor 165 itself. According to example embodiments, by using a fused silica wafer instead of the silicon wafer W, it is possible to enable practical noise-free inspection.

According to some embodiments, the wafer W may include a silicon wafer on which a Sift thin film is formed and a silicon-on-insulator (SOI) wafer. According to some embodiments, the wafer W may include a $Si_3N_4$ wafer, a sapphire wafer, a SiC wafer, and a diamond wafer.

Figure 5:
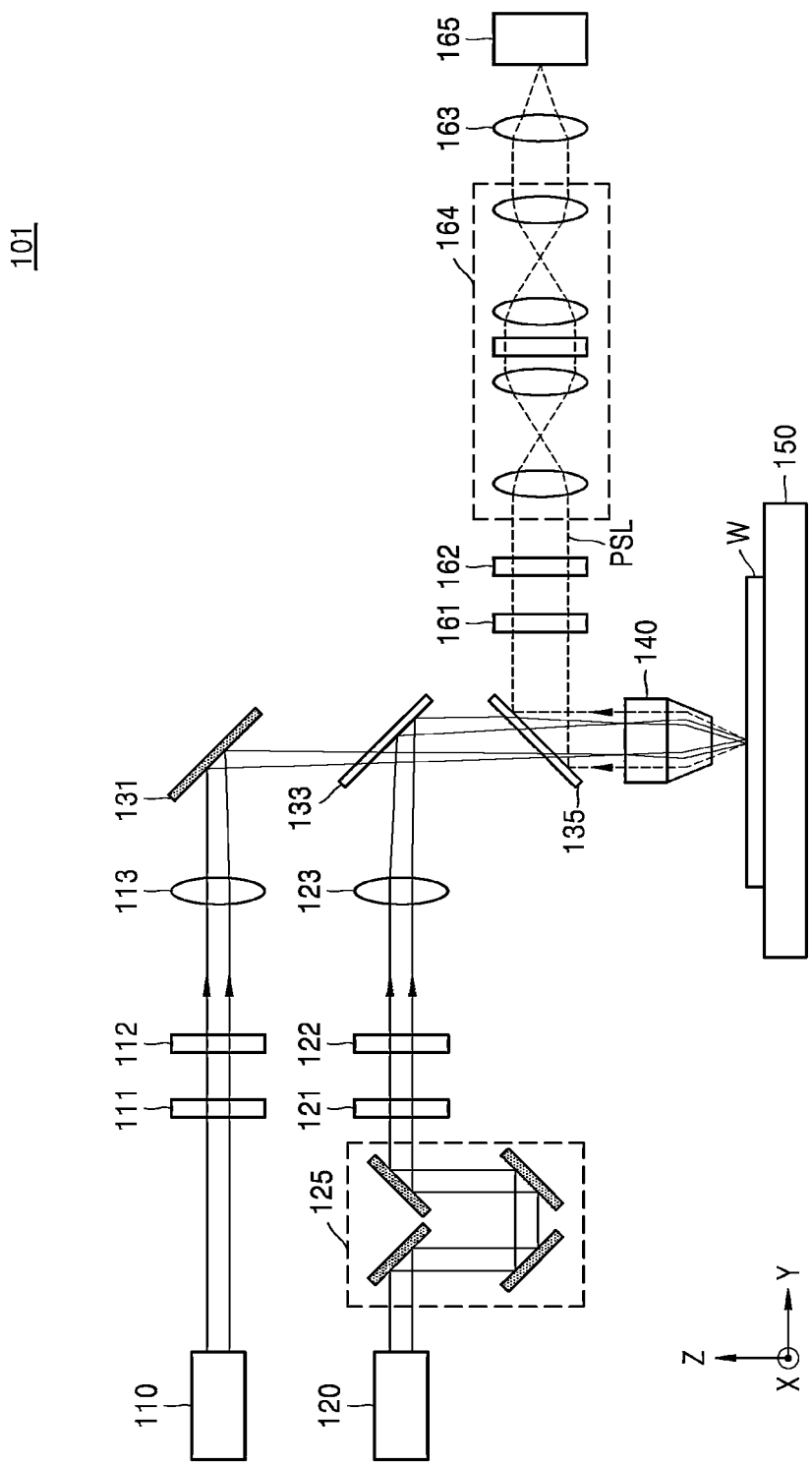
FIG. 5 is a schematic diagram for describing a wafer inspection apparatus according to some embodiments.

FIG. 5 is a schematic diagram illustrating a wafer inspection apparatus 101 according to some embodiments.

For convenience of description, descriptions that are overlapping with those described with reference to FIGS. 1 to 4 may be omitted, and differences will be mainly described.

Referring to FIG. 5, similar to the wafer inspection apparatus 100 of FIG. 1, the wafer inspection apparatus 101 may include the first laser device 110, the first half-wave plate 111 the first polarizer 112, the first focusing lens 113, the second laser device 120, the second half-wave plate 121, the second polarizer 122, the second focusing lens 123, the mirror 131, the first dichroic mirror 133, the second dichroic mirror 135, the objective lens 140, the stage 150, the third polarizer 161, the band pass filter 162, the imaging lens 163, and the image sensor 165.

According to example embodiments, the wafer inspection apparatus 101 may further include a pupil masking 164. Accordingly, the wafer inspection apparatus 101 may remove noise existing in a certain area on the pupil plane, and the SNR of the wafer inspection apparatus 101 may be improved.

Figure 6A:
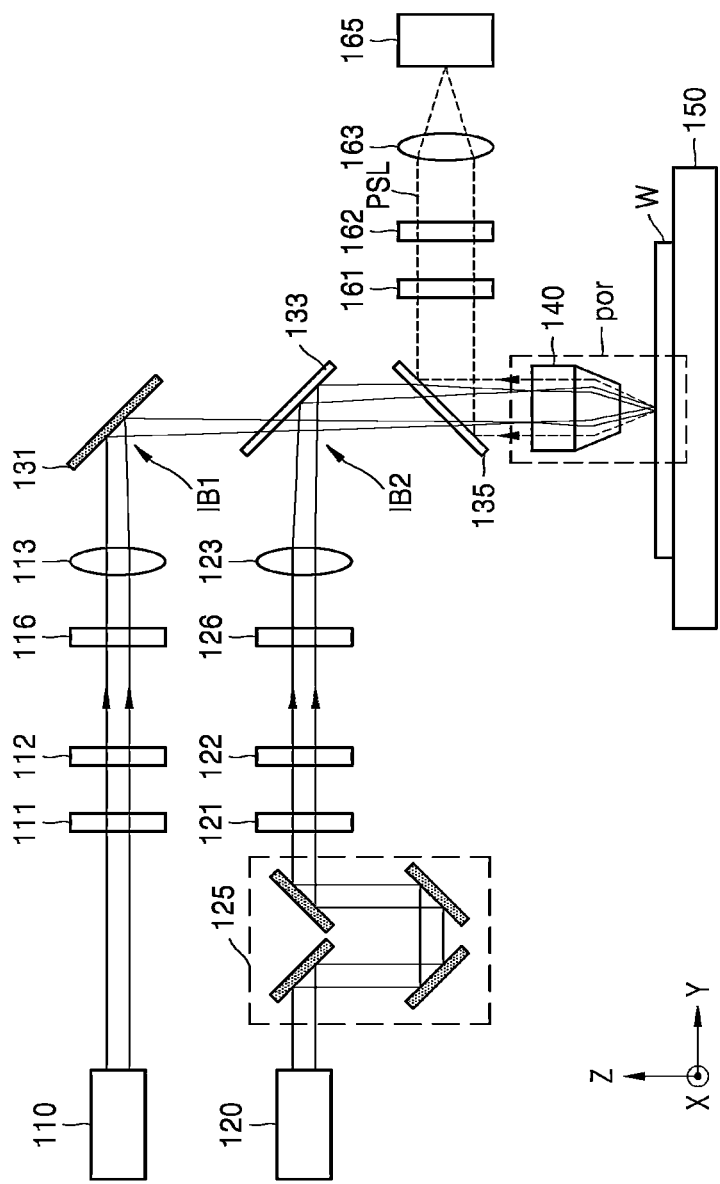
FIG. 6A is a schematic diagram illustrating a wafer inspection apparatus according to other example embodiments.

FIG. 6A is a schematic diagram illustrating a wafer inspection apparatus 102 according to some embodiments.

Figure 6B:
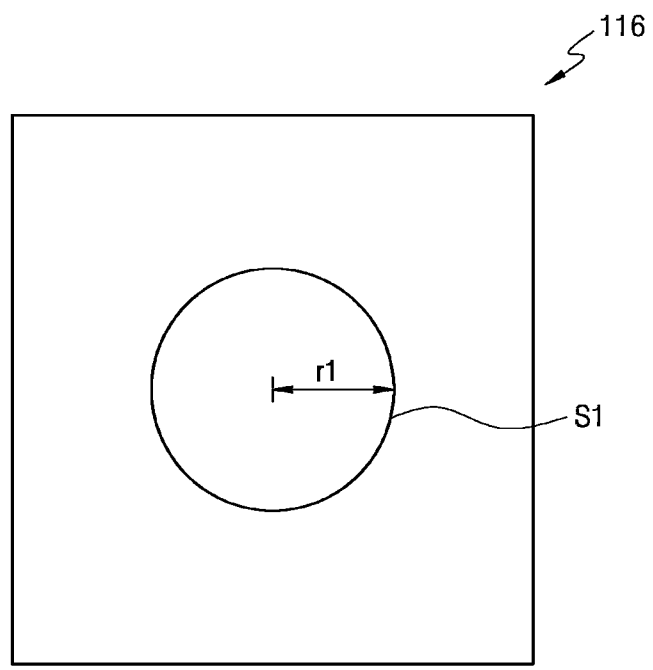
FIGS. 6B and 6C are top plan views illustrating structures of first and second beam shapers included in the wafer inspection apparatus according to some embodiments.
Figure 6C:
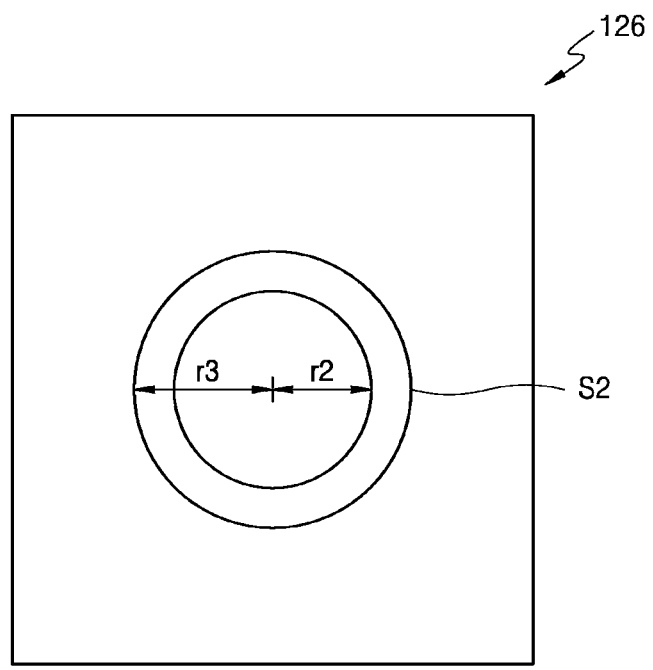

FIGS. 6B and 6C are plan views for explaining the structure of the first and second beam shapers 116 and 126 included in the wafer inspection apparatus 102.

Referring to FIGS. 6A to 6C, similar to the wafer inspection apparatus 100 of FIG. 1, the wafer inspection apparatus 102 may include the first laser device 110, the first half-wave plate 111 the first polarizer 112, the first focusing lens 113, the second laser device 120, the second half-wave plate 121, the second polarizer 122, the second focusing lens 123, the mirror 131, the first dichroic mirror 133, the second dichroic mirror 135, the objective lens 140, the stage 150, the third polarizer 161, the band pass filter 162, the imaging lens 163, and the image sensor 165.

According to example embodiments, the wafer inspection apparatus 102 may be a stimulated emission depletion (STED) microscope. A STED technology is for realizing an ultra-high resolution microscope, which generates an ultra-high resolution image by selectively deactivating an output signal (e.g., a nonlinear optical signal) and improves the resolution of the optical system by minimizing an illumination area at a focal point.

According to example embodiments, the wafer inspection apparatus 102 may further include the first beam shaper 116 on the optical path of the first input beam IB1 and the second beam shaper 126 on the optical path of the second input beam IB2. Each of the first and second beam shapers 116 and 126 may include any one of a phase shift mask and a spatial light modulator. Accordingly, the shape of the cross section of at least one of the first and second input beams IB1 and IB2 may be adjusted. According to example embodiments, the nonlinear optical phenomenon on the wafer W occurs only in a region where the first and second input beams IB1 and IB2 overlap.

The first beam shaper 116 may include an approximately circular first slit S1. Accordingly, the first input beam IB1 passing through the first beam shaper 116 may have an approximately circular beam cross section. The first slit S1 may have a first radius r1.

The second beam shaper 126 may include a second slit S2 in a donut or ring shape. Accordingly, the second input beam IB2 passing through the second beam shaper 126 may have an approximately donut-shaped or ring-shaped beam cross section. An inner radius of the second slit S2 may be a second radius r2 and an outer radius may be a third radius r3. The second radius r2 may be smaller than the first radius r1, and the third radius r3 may be larger than the first radius r1.

Figure 7:
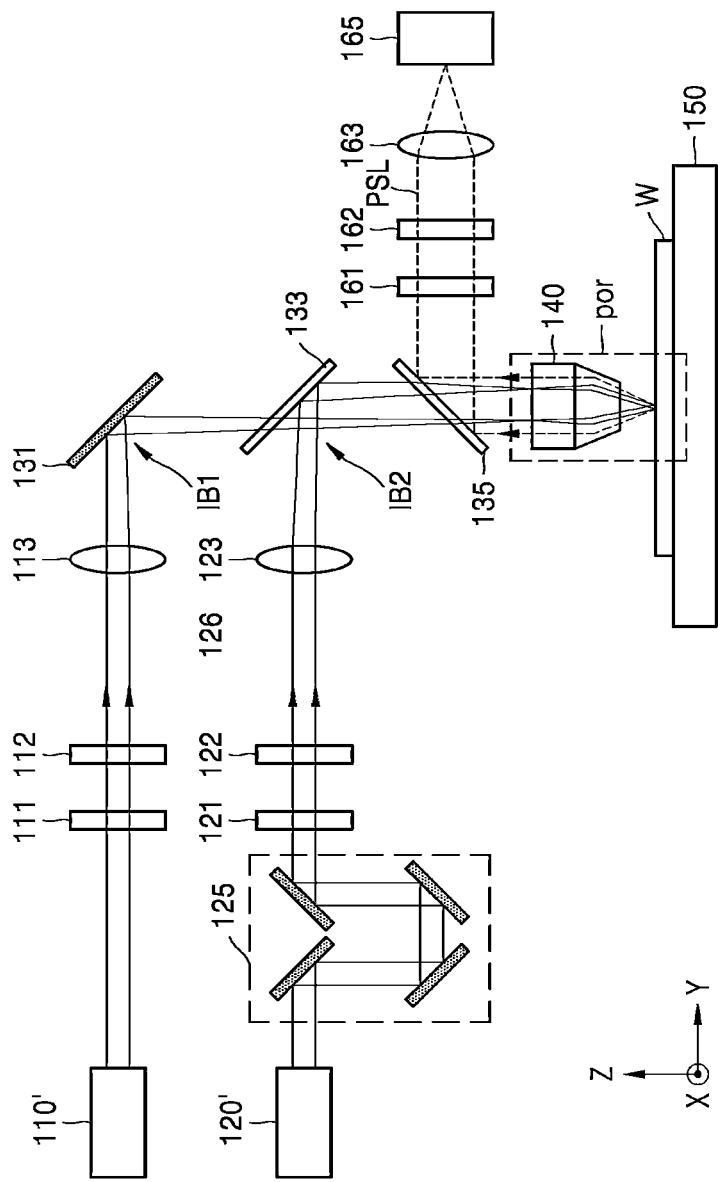
FIG. 7 is a schematic diagram for explaining a wafer inspection apparatus according to some embodiments.

FIG. 7 is a schematic diagram illustrating a wafer inspection apparatus 103 according to some embodiments.

Referring to FIG. 7, the wafer inspection apparatus 103 may include a first light source 110', the first half-wave plate 111, the first polarizer 112, the first focusing lens 113, a second light source 120', the second half-wave plate 121, the second polarizer 122, the second focusing lens 123, the mirror 131, the first dichroic mirror 133, the second dichroic mirror 135, the objective lens 140, the stage 150, the third polarizer 161, the band pass filter 162, the imaging lens 163, and the image sensor 165.

Unlike in FIG. 1, the first and second light sources 110' and 120' included in the wafer inspection apparatus 103 may be variable wavelength light sources. The first and second light sources 110' and 120' may include, for example, a variable filter and a light source that is a broadband source. The variable filter may be, for example, a turret composed of a plurality of filters.

According to some embodiments, the first and second light sources 110' and 120' may be a frequency comb light source. Here, the frequency comb light source may be a laser source having a frequency spectrum characteristic consisting of separated frequency lines with equal intervals.

When the first and second light sources 110' and 120' are variable wavelength light sources or frequency comb light sources, since the phonon energy of a material may be measured using the CARS phenomenon, the physical properties of particle defects may be analyzed. Accordingly, the wafer inspection apparatus 103 may inspect various defects composed of two or more materials that may occur in a chemical vapor deposition (CVD) or epitaxy equipment.

Figure 8:
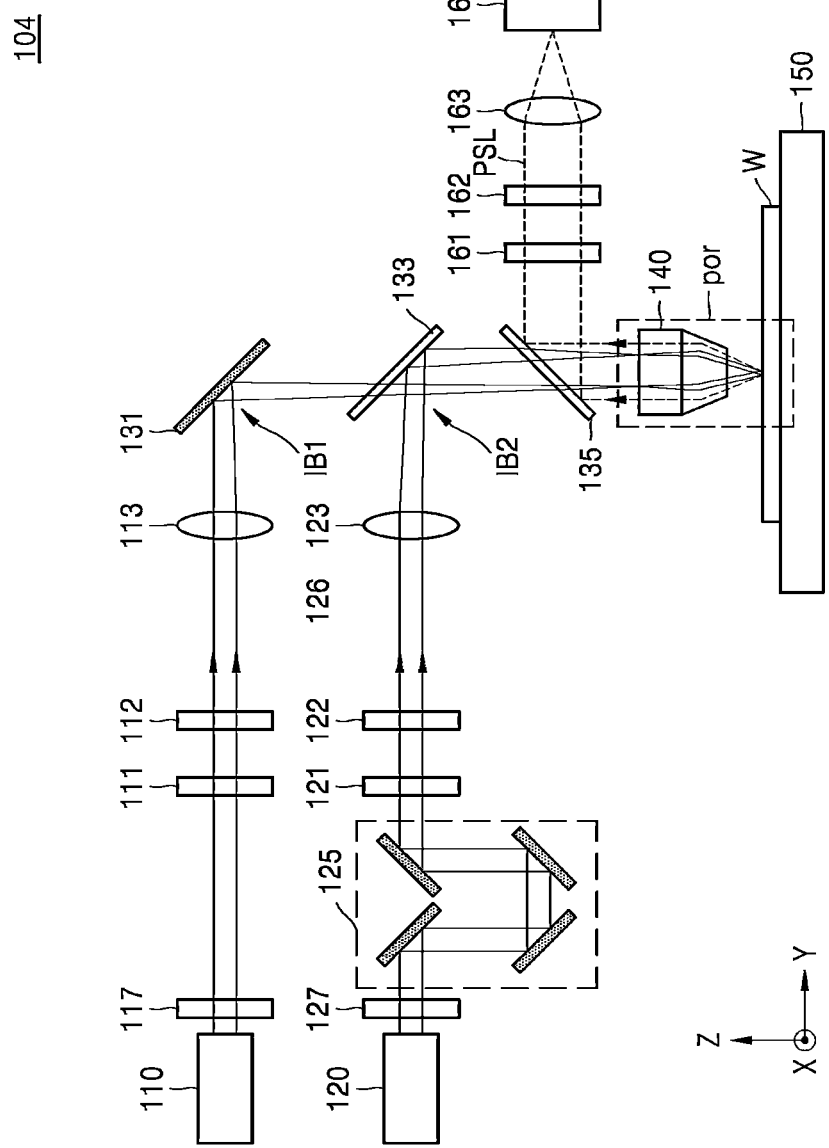
FIG. 8 is a schematic diagram for explaining a wafer inspection apparatus according to some embodiments.

FIG. 8 is a schematic diagram illustrating a wafer inspection apparatus 104 according to some embodiments.

Referring to FIG. 8, the wafer inspection apparatus 104 may include the first laser device 110, the first half-wave plate 111 the first polarizer 112, the first focusing lens 113, the second laser 120, the second half-wave plate 121, the second polarizer 122, the second focusing lens 123, the mirror 131, the first dichroic mirror 133, the second dichroic mirror 135, the objective lens 140, the stage 150, the third polarizer 161, the band pass filter 162, the imaging lens 163, and the image sensor 165.

According to example embodiments, the wafer inspection apparatus 104 may further include first and second amplifiers 117 and 127. The first amplifier 117 may amplify the intensity of the first input beam IB1, and the second amplifier 127 may amplify the intensity of the second input beam IB2. According to example embodiments, each of the first and second amplifiers 117 and 127 may be an Optical Parametric Chirped-pulse Amplifier (OPCPA). Accordingly, by employing the first and second amplifiers 117 and 127 to increase the intensity of each of the first and second input beams IB1 and IB2, and to increase the size of the beam cross-sectional area of each of the first and second input beams IB1 and IB2, while the field-of-view (FOV) of the wafer inspection apparatus 104 may be widened, the power of light per unit area may be kept constant. Further, by increasing the pulse frequency of the first and second input beams IB1 and IB2, the number of photons detected by the image sensor 165 per unit time may be increased, and accordingly, the inspection speed of the wafer inspection apparatus 100 may be improved.

Figure 9:
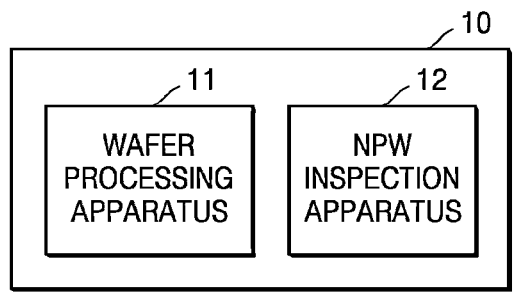
FIG. 9 is a block diagram illustrating a system including a wafer inspection apparatus according to example embodiments.

FIG. 9 is a block diagram illustrating a system 10 including the wafer inspection apparatus according to example embodiments.

According to example embodiments, the system 10 may include a wafer processing apparatus 11 and a non-patterned wafer (NPW) inspection apparatus 12.

The system 10 may process a first wafer. The processing of the first wafer may include various processes for forming a semiconductor device on the first wafer. The processing of the first wafer includes, for example, an ion doping process, an oxidation process for forming an oxide film, a lithography process including spin coating, exposure and development, a thin film deposition process, a dry etching process, a wet etching process, and a metal wiring process.

The first wafer may include, for example, silicon (Si). The first wafer may include a semiconductor element such as germanium (Ge), or a compound semiconductor such as silicon carbide (SiC), gallium arsenide (GaAs), indium arsenide (InAs), and indium phosphide (InP). According to some embodiments, the first wafer may have a silicon on insulator (SOI) structure. The first wafer may include a buried oxide layer. According to some embodiments, the first wafer may include a conductive region, for example, a well doped with impurities. According to some embodiments, the first wafer may have various device isolation structures such as shallow trench isolation (STI) separating the doped wells from each other.

The processing of the first wafer may be performed by the wafer processing apparatus 11. The wafer processing apparatus 11 may include, for example, various equipment such as a stepper type or scanner type exposure apparatus, dry/wet etching equipment, plasma etching equipment, cleaner equipment, plasma asher equipment, polishing equipment such as chemical mechanical polishing (CMP), ion implantation equipment, physical vapor deposition (PVD) equipment, CVD equipment, atomic layer deposition (ALD) equipment, annealing equipment, etc.

The system 10 may inspect a second wafer. The second wafer may be different from the first wafer. As described above, the second wafer may be any one of a fused silica wafer, a silicon wafer on which a Sift thin film is formed, a silicon-on-insulator (SOI) wafer, a $Si_3N_4$ wafer, a sapphire wafer, a SiC wafer, and a diamond wafer.

The inspection of the second wafer may be performed by the non-patterned wafer (NPW) inspection apparatus 12. After the second wafer is loaded into the wafer processing apparatus 11 and unloaded again, the second wafer may be inspected by the NPW inspection apparatus 12. The NPW inspection apparatus 12 may check the occurrence and location of particle contamination on the second wafer, and may check the state of the wafer processing apparatus 11 based on the occurrence and location of the particle contamination. The NPW inspection apparatus 12 may be any one of the wafer inspection apparatuses 100, 101, 102, 103, and 104 of FIGS. 1 and 5 to 8.

The system according to example embodiments includes the NPW inspection device 12 that is an in-line type, and thus, the system may monitor whether the initial state of the process and equipment is defective. Accordingly, it is possible to contribute to early identification of the cause of defects and improvement of yield. In addition, when developing processes and equipment, the effects of process changes and equipment changes may be separated from the effects of particle defects, thereby improving the efficiency of process and equipment development.

Figure 10:
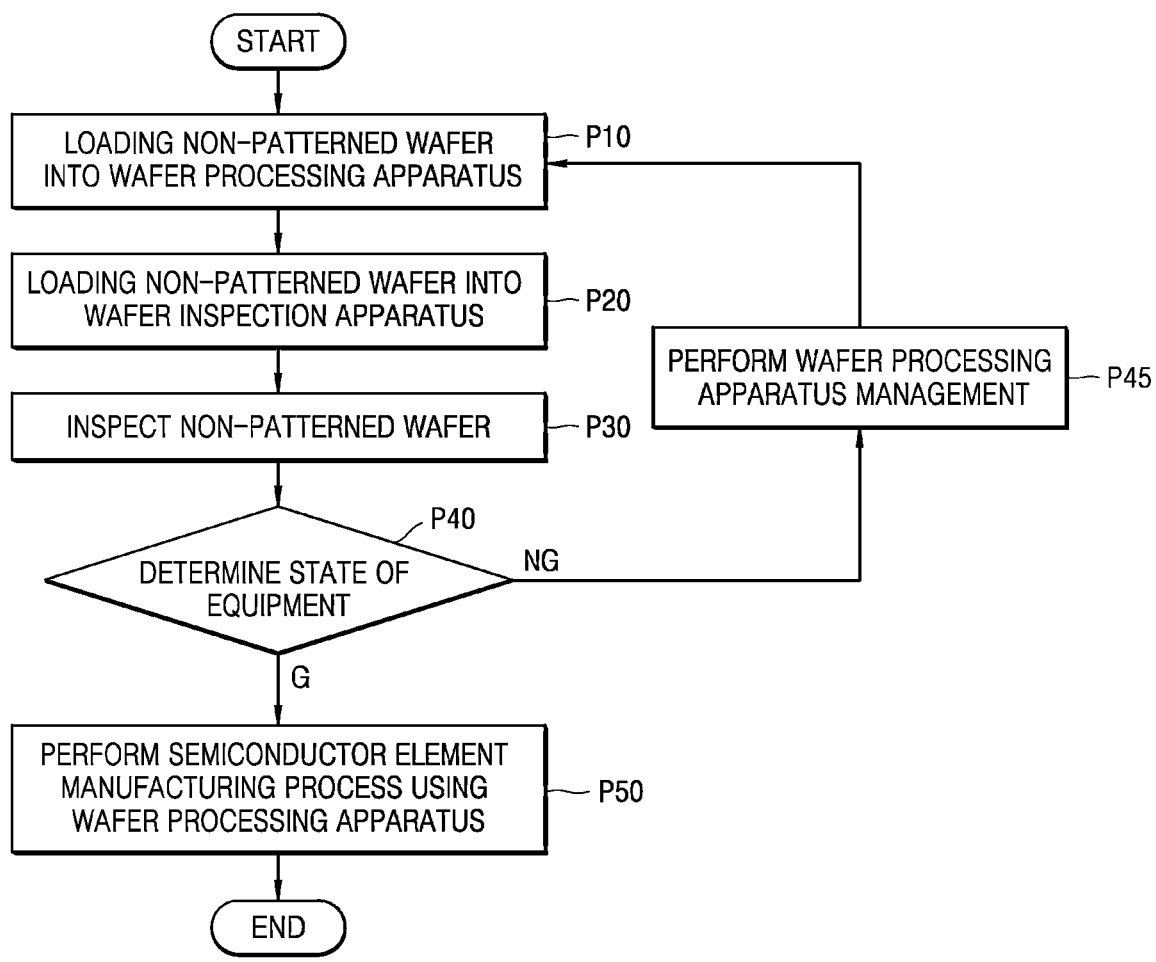
FIG. 10 is a flowchart illustrating a method of manufacturing a semiconductor device according to example embodiments.

FIG. 10 is a flowchart illustrating a method of manufacturing a semiconductor device according to example embodiments.

Referring to FIGS. 9 and 10, in P10, a non-patterned wafer may be loaded into the wafer processing apparatus 11.

Subsequently, in P20, the non-patterned wafer may be unloaded from the wafer processing apparatus 11 and loaded into the NPW inspection apparatus 12.

Subsequently, in P30, the loaded non-patterned wafer may be inspected. The inspection of the non-patterned wafer and the wafer processing apparatus 11 using the same is as described with reference to FIGS. 1 to 4. The inspection of a non-patterned wafer may include irradiating two input beams to be focused on the back focal plane of an objective lens and measuring nonlinear scattered light generated by particles on the wafer.

Subsequently, in P40, the inspection of the non-patterned wafer may include determining the state of the wafer processing apparatus 11 from the image generated based on the non-linear scattered light generated from the non-patterned wafer.

When it is determined in P40 that the equipment state is good (G), in P50, the semiconductor element manufacturing process may be performed using the wafer processing apparatus 11.

If it is determined in P40 that the equipment condition is not good (NG), in P45, management of the wafer processing apparatus 11 may be performed. The management of the wafer processing apparatus 11 may include replacement of consumables within the equipment and performing an equipment cleaning process. After performing the management of the wafer processing apparatus 11 in P45, it is possible to return to P10 again and check the result of the management of the wafer processing apparatus 11.

While the inventive concept has been particularly shown and described with reference to embodiments thereof, it will be understood that various changes in form and details may be made therein without departing from the scope of the following claims.

What is claimed is:

1. A wafer inspection apparatus comprising:
   a stage configured to support a wafer;
   a first laser device configured to emit a first input beam to the wafer;
   a second laser device configured to emit a second input beam to the wafer;
   an objective lens on an optical path of the first and second input beams;
   a first focusing lens located between the first laser device and the objective lens and configured to focus the first input beam;
   a second focusing lens located between the second laser device and the objective lens and configured to focus the second input beam; and
   an image sensor configured to generate an image of the wafer based on scattered light according to a nonlinear optical phenomenon of the first and second input beams,
   wherein the first input beam passing through the objective lens is obliquely incident on the wafer at a first incident angle with respect to a vertical line that is normal to an upper surface of the wafer,
   the second input beam passing through the objective lens is incident on the wafer at a second incident angle oblique to the vertical line that is normal to the upper surface of the wafer, and
   the first and second incident angles are different from each other.

2. The wafer inspection apparatus of claim 1, wherein no pattern is formed on the wafer.

3. The wafer inspection apparatus of claim 2, wherein the wafer is any one of a fused silica wafer, a silicon wafer on which a $SiO_2$ thin film is formed, a silicon-on-insulator (SOI) wafer, a $Si_3N_4$ wafer, a sapphire wafer, a SiC wafer, and a diamond wafer.

4. The wafer inspection apparatus of claim 1, wherein the first focusing lens is configured to focus the first input beam on a back focal plane of the objective lens, and
   the second focusing lens is configured to focus the second input beam on the back focal plane of the objective lens.

5. The wafer inspection apparatus of claim 4, wherein a first focal point of the first input beam on the back focal plane of the objective lens is spaced apart from a second focal point of the second input beam on the back focal plane of the objective lens and an optical axis of the objective lens is between the first focal point and the second focal point.

6. The wafer inspection apparatus of claim 5, wherein the first and second input beams emitted from the objective lens are collimated.

7. The wafer inspection apparatus of claim 1, wherein the first and second input beams are in the infrared wavelength band.

8. The wafer inspection apparatus of claim 1, further comprising a band pass filter interposed between the image sensor and the wafer,
   wherein the band pass filter is configured to pass a component of the visible light band out of the scattered light due to the nonlinear optical phenomenon.

9. The wafer inspection apparatus of claim 1, wherein the scattered light due to surface roughness of the wafer is not incident on the objective lens.

10. A system comprising: a wafer processing apparatus; and a wafer inspection apparatus, wherein the wafer inspection apparatus includes:
    a first input optical system configured to irradiate a first input beam onto a wafer;
    a second input optical system configured to irradiate a second input beam onto the wafer;
    an objective lens configured to overlap the first and second input beams on a portion of the wafer; and
    an image sensor configured to generate an image of the wafer based on nonlinear scattered light generated from the portion of the wafer based on the first and second input beams,
    wherein paths of the first and second input beams are each spaced apart from an optical axis of the objective lens,
    wherein the first input beam is focused on a first focal point on a back focal plane of the objective lens, and the second input beam is focused on a second focal point on the back focal plane,
    wherein the first and second focal points are spaced apart from each other.

11. The system of claim 10, wherein the first and second focal points are spaced apart from each other and the optical axis of the objective lens is between the first and second focal points.

12. The system of claim 10, wherein the first input optical system is configured to move the first focal point on the back focal plane of the objective lens, and
    the second input optical system is configured to move the second focal point on the back focal plane of the objective lens.

13. The system of claim 10, wherein the nonlinear scattered light due to surface roughness of the wafer is not incident on the objective lens.

14. The system of claim 10, wherein the first and second input beams have a wavelength in an infrared band, and the nonlinear scattered light has a wavelength in a visible light band.

15. The system of claim 10, wherein the wafer is a non-patterned wafer unloaded from the wafer processing apparatus.

16. The system of claim 15, wherein the wafer is any one of a fused silica wafer, a silicon wafer on which a $SiO_2$ thin film is formed, a silicon-on-insulator (SOI) wafer, a $Si_3N_4$ wafer, a sapphire wafer, a SiC wafer, and a diamond wafer.

17. A wafer inspection apparatus comprising:
a first input optical system configured to emit a first input beam to a wafer;
a second input optical system configured to emit a second input beam to the wafer;
an objective lens configured to overlap the first and second input beams on a portion of the wafer; and
an image sensor configured to generate an image of the wafer based on nonlinear scattered light generated from the portion of the wafer based on the first and second input beams,
wherein the nonlinear scattered light due to surface roughness of the wafer is not incident on the objective lens.

18. The wafer inspection apparatus of claim 17, wherein the nonlinear scattered light is generated by a third order nonlinear optical phenomenon.

19. The wafer inspection apparatus of claim 17, wherein the nonlinear scattered light is generated by any one of four-wave mixing (FWM) and coherent anti-stokes Raman scattering (CARS).

20. The wafer inspection apparatus of claim 17, wherein the first input beam is focused on a first focal point on a back focal plane of the objective lens, and
the second input beam is focused on a second focal point on the back focal plane, and
the first and second focal points are spaced apart from each other.

* * * * *